(12) United States Patent
Zhou et al.

(10) Patent No.: US 12,048,085 B2
(45) Date of Patent: Jul. 23, 2024

(54) POWER ELECTRONICS COOLING ASSEMBLIES AND METHODS FOR MAKING THE SAME

(71) Applicants: Toyota Motor Engineering & Manufacturing North America, Inc., Plano, TX (US); Toyota Jidosha Kabushiki Kaisha, Aichi-ken (JP)

(72) Inventors: Feng Zhou, Ann Arbor, MI (US); Shohei Nagai, Aichi (JP)

(73) Assignees: TOYOTA MOTOR ENGINEERING & MANUFACTURING NORTH AMERICA, INC., Plano, TX (US); TOYOTA JIDOSHA KABUSHIKI KAISHA, Aichi-ken (JP)

(*) Notice: Subject to any disclaimer, the term of this patent is extended or adjusted under 35 U.S.C. 154(b) by 0 days.

(21) Appl. No.: 18/306,720

(22) Filed: Apr. 25, 2023

(65) Prior Publication Data

US 2023/0262871 A1 Aug. 17, 2023

Related U.S. Application Data

(63) Continuation of application No. 16/993,725, filed on Aug. 14, 2020, now Pat. No. 11,665,813.

(51) Int. Cl.
*H05K 1/02* (2006.01)
*H05K 3/00* (2006.01)
*H05K 7/20* (2006.01)

(52) U.S. Cl.
CPC ......... *H05K 1/0209* (2013.01); *H05K 1/0207* (2013.01); *H05K 3/0061* (2013.01); *H05K 7/20254* (2013.01); *H05K 7/205* (2013.01)

(58) Field of Classification Search
CPC ...... H05K 1/0209; H05K 1/0207; H05K 7/06; H05K 7/1432; H05K 7/20218; H05K 7/20254–20263; H05K 7/20272; H05K 7/2039; H05K 7/20509; H05K 7/20954; H05K 7/20927–20936; H05K 2201/064; H01L 23/3672; H01L 23/4006; H01L 23/473; H01L 2023/4087; H01H 9/52
See application file for complete search history.

(56) References Cited

U.S. PATENT DOCUMENTS 7,289,329 B2 10/2007 Chen et al.
7,583,506 B1 9/2009 Huang et al.
(Continued)

FOREIGN PATENT DOCUMENTS

| CN | 206849831 U | 1/2018 |
| CN | 110289230 A | 9/2019 |
| JP | 5338830 B2 | 8/2013 |

*Primary Examiner* — Amir A Jalali
(74) *Attorney, Agent, or Firm* — DINSMORE & SHOHL LLP (57) ABSTRACT

A power electronics module includes a heat sink structurally configured to dissipate thermal energy, an electrically-insulating layer directly contacting the heat sink, a conductive substrate positioned on and in direct contact with the electrically-insulating layer, a power electronics device positioned on and in direct contact with the conductive substrate, a printed circuit board layer that at least partially encapsulates the conductive substrate and the power electronics device, and a driver circuit component positioned on a surface of the printed circuit board layer.

14 Claims, 10 Drawing Sheets

(56) References Cited

U.S. PATENT DOCUMENTS

| | | | |
|---|---|---|---|
| 7,671,467 B2 | 3/2010 | Nonaka et al. | |
| 10,149,413 B1* | 12/2018 | Dede | H05K 7/20927 |
| 11,239,137 B1* | 2/2022 | Zhou | H01L 21/4803 |
| 2006/0038284 A1 | 2/2006 | Brandenburg et al. | |
| 2006/0120060 A1 | 6/2006 | Boudreaux et al. | |
| 2012/0298408 A1 | 11/2012 | Nagatomo et al. | |
| 2014/0167248 A1* | 6/2014 | Delgado | H01L 24/83 |
| | | | 257/713 |
| 2015/0000868 A1 | 1/2015 | Sri-Jayantha et al. | |
| 2018/0211899 A1* | 7/2018 | Morianz | H01L 24/20 |
| 2020/0152557 A1* | 5/2020 | Lim | H01L 24/24 |
| 2020/0258812 A1 | 8/2020 | Marlow et al. | |
| 2020/0328139 A1 | 10/2020 | Chiu et al. | |
| 2021/0057878 A1 | 2/2021 | Oomori | |
| 2022/0013431 A1* | 1/2022 | Zhou | H01L 23/3677 |
| 2022/0039252 A1* | 2/2022 | Zhou | H05K 1/185 |
| 2022/0053634 A1* | 2/2022 | Zhou | H01L 23/427 |

* cited by examiner

POWER ELECTRONICS COOLING ASSEMBLIES AND METHODS FOR MAKING THE SAME

CROSS-REFERENCE TO RELATED APPLICATIONS

This application is a continuation of U.S. patent application Ser. No. 16/993,725 filed on Aug. 14, 2020 and entitled "Power Electronics Cooling Assemblies and Methods for Making the Same," the contents of which is incorporated by references in its entirety.

TECHNICAL FIELD

The present specification relates to power electronics cooling assemblies and methods for making the same.

BACKGROUND

Power electronics devices embedded in printed circuit boards may be utilized in a variety of applications. For example, in vehicular applications, printed circuit board embedded power electronics devices may be used to convert direct current (DC) into alternating current (AC) to power a motor. In such applications, power electronics devices may be thermally coupled to heat sinks and the like to dissipate heat from the power electronics devices. However, conventional printed circuit board embedded power electronics modules may include one or more intermediate layers positioned between the power electronics device and the heat sink, which may impede the dissipation of heat from the power electronics devices.

SUMMARY

Accordingly a need exists for improved printed circuit board embedded power electronics modules that reduce thermal resistance between power electronics devices and a heat sink of the power electronics module. Printed circuit board embedded power electronics modules according to the present disclosure generally include power electronics devices in direct contact with conductive substrates that are in direct contact with an electrically-insulating layer. The electrically-insulating layer is in direct contact with a heat sink. The direct contact between the conductive substrates and the heat sink with the electrically-insulating layer minimizes intermediate components positioned between the power electronics devices and the heat sink, thereby minimizing thermal resistance between the power electronics devices and the heat sink. By minimizing thermal resistance between the power electronics devices and the heat sink, the amount of heat dissipated from the power electronics devices can be increased as compared to configurations including intermediate components positioned between the power electronics devices and the heat sink. By increasing the amount of heat that can be dissipated from the power electronics devices, the power electronics devices can be maintained at lower operating temperatures. Additionally, by increasing the amount of heat that can be dissipated from the power electronics devices, the power electronics devices can be operated at higher power outputs while maintaining a similar operating temperature as compared to conventional configurations.

In one embodiment, a power electronics module includes a heat sink structurally configured to dissipate thermal energy, an electrically-insulating layer directly contacting the heat sink, a conductive substrate positioned on and in direct contact with the electrically-insulating layer, a power electronics device positioned on and in direct contact with the conductive substrate, a printed circuit board layer that at least partially encapsulates the conductive substrate and the power electronics device, and a driver circuit component positioned on a surface of the printed circuit board layer.

In another embodiment, a method for forming a power electronics module includes positioning an electrically-insulating layer on a surface of a heat sink, positioning a conductive substrate on a surface of the electrically-insulating layer opposite the heat sink, positioning a power electronics device on a surface of the conductive substrate opposite the electrically-insulating layer, positioning a printed circuit board layer over the electrically-insulating layer, at least partially embedding the electrically-insulating layer, the conductive substrate, and the power electronics device, and positioning a driver circuit component on a surface of the printed circuit board layer opposite the heat sink.

In yet another embodiment, a power electronics module includes a heat sink structurally configured to dissipate thermal energy, an electrically-insulating layer directly contacting the heat sink, a first conductive substrate in direct contact with the electrically-insulating layer, a second conductive substrate in direct contact with the electrically-insulating layer and spaced apart from the first conductive substrate, a first power electronics device positioned on and in direct contact with the first conductive substrate, a second power electronics device positioned on and in direct contact with the second conductive substrate, a conduit extending between and electrically coupling the first power electronics device and the second power electronics device, where the first conductive substrate and the second conductive substrate are positioned between the conduit and the electrically-insulating layer, and a printed circuit board layer that at least partially encapsulates first conductive substrate, the second conductive substrate, the first power electronics device and the second power electronics device.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are generally directed to power electronics modules including power electronics devices in direct contact with conductive substrates that are in direct contact with an electrically-insulating layer. The electrically-insulating layer is in direct contact with a heat sink. The direct contact between the conductive substrates and the heat sink with the electrically-insulating layer minimizes intermediate components positioned between the power electronics devices and the heat sink, thereby minimizing thermal resistance between the power electronics devices and the heat sink. By minimizing thermal resistance between the power electronics devices and the heat sink, the amount of heat dissipated from the power electronics devices can be increased as compared to configurations including intermediate components positioned between the power electronics devices and the heat sink. By increasing the amount of heat that can be dissipated from the power electronics devices, the power electronics devices can be maintained at lower operating temperatures. Additionally, by increasing the amount of heat that can be dissipated from the power electronics devices, the power electronics devices can be operated at higher power outputs while maintaining a similar operating temperature as compared to conventional configurations. These and other embodiments will now be described with reference to the appended figures.

Figure 1:
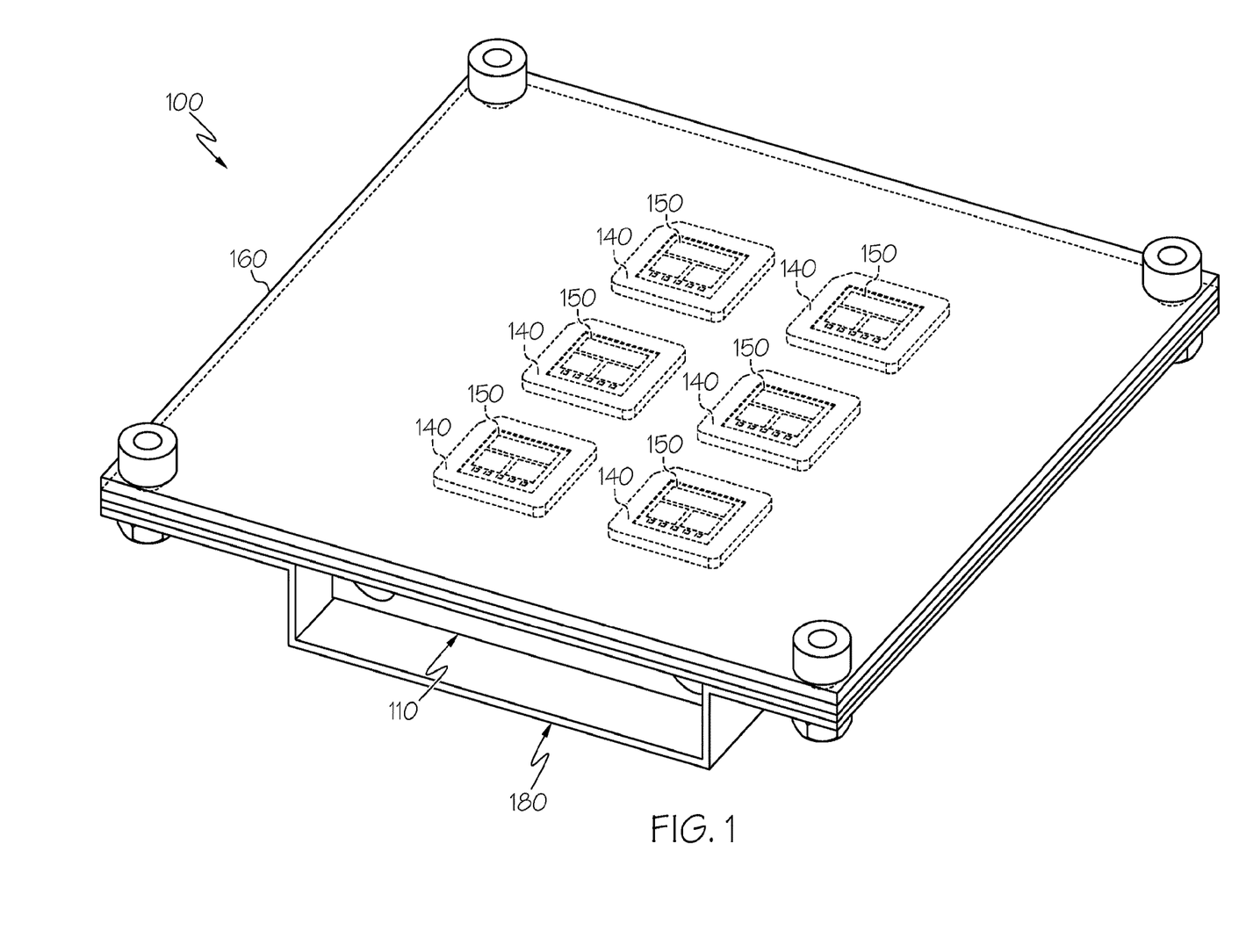
FIG. 1 schematically depicts a perspective view of a power electronics module, according to one or more embodiments shown and described herein.
Figure 2:
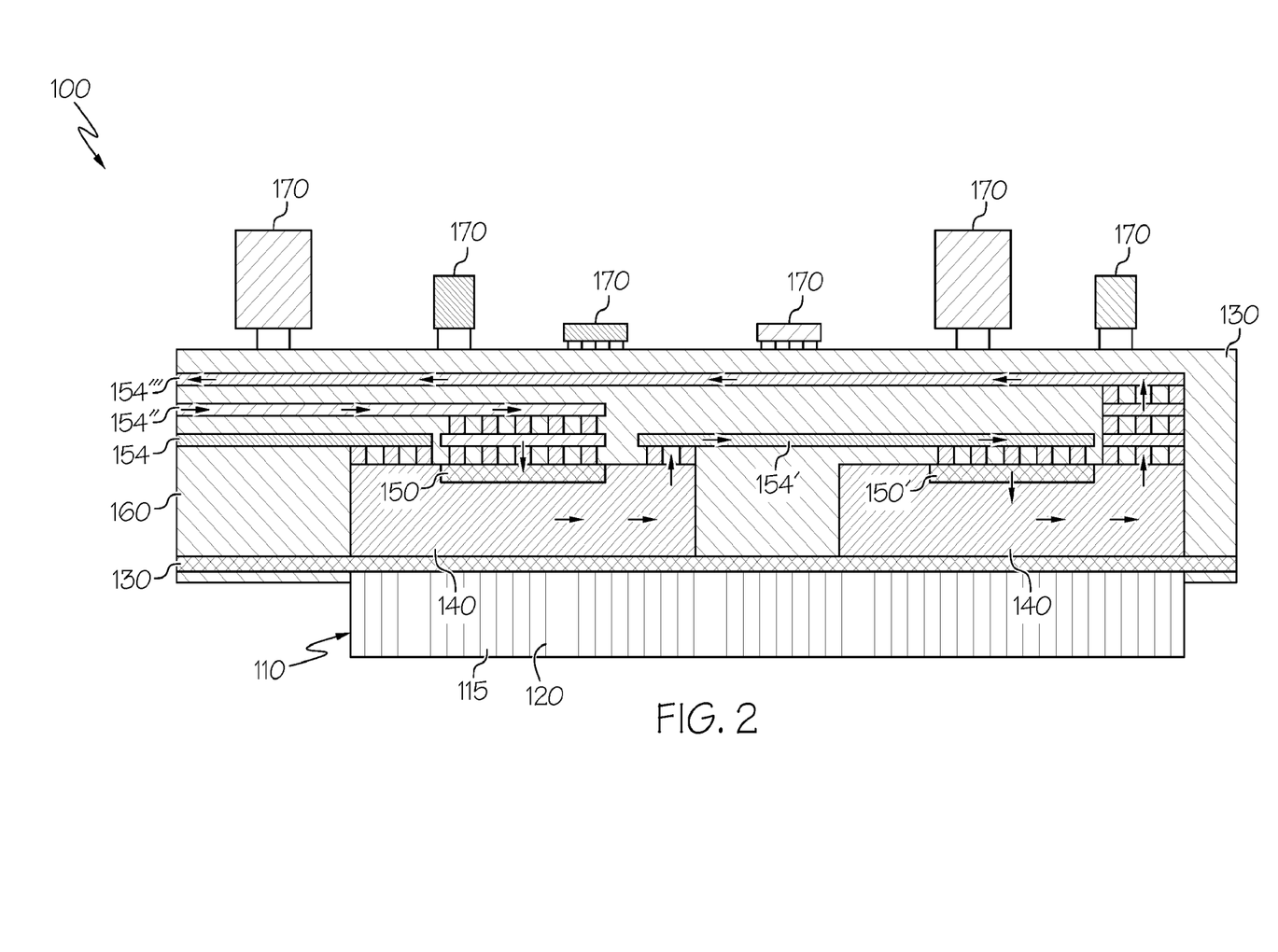
FIG. 2 schematically depicts a section view of the power electronics module of FIG. 1, according to one or more embodiments shown and described herein.

Referring initially to FIGS. 1 and 2, a perspective view and a section view of a power electronics module 100 are schematically depicted, respectively. In embodiments, the power electronics module 100 generally includes a heat sink 110, an electrically-insulating layer 130, one or more conductive substrates 140, one or more power electronics devices 150, a printed circuit board layer 160, and one or more driver circuit components 170.

Figure 3:
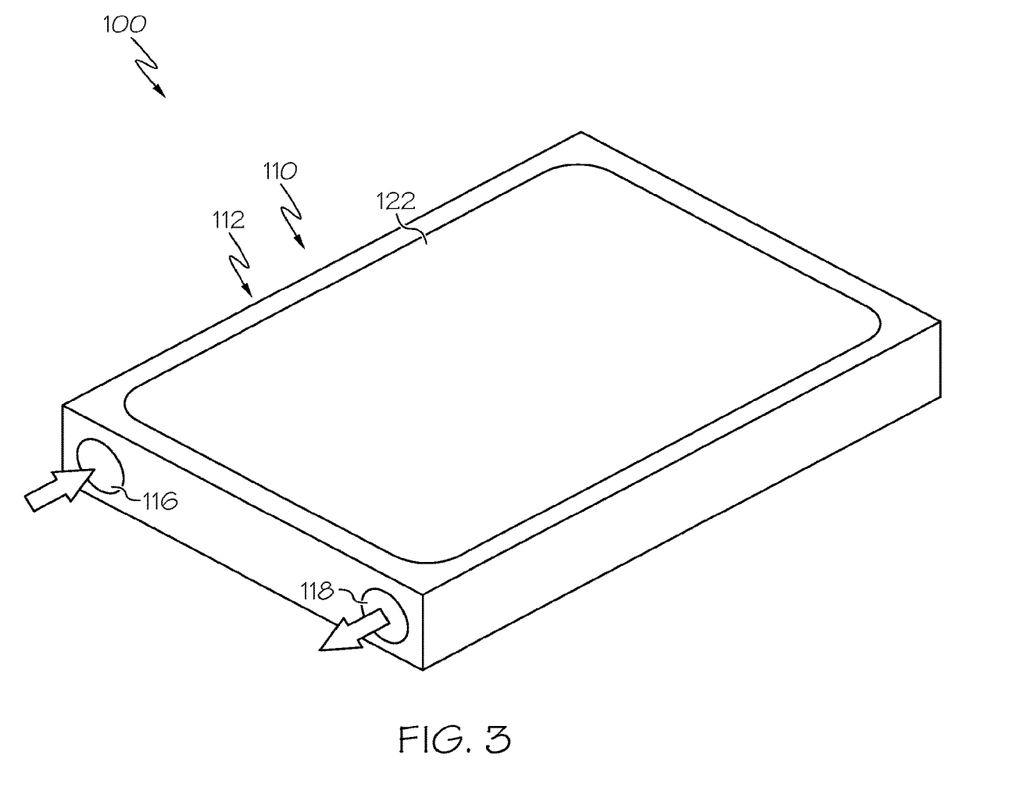
FIG. 3 schematically depicts a perspective view of a heat sink of the power electronics module of FIG. 1, according to one or more embodiments shown and described herein.

Referring to FIGS. 2 and 3, a perspective view of the heat sink 110 is schematically depicted. In embodiments, the heat sink 110 is structurally configured to dissipate thermal energy. In some embodiments, the heat sink 110 is a cold plate 112 including an inlet 116 and an outlet 118 through which cooling fluid can pass. For example, cooling fluid may enter the cold plate 112 through the inlet 116, may flow through one or more fluid passageways 115 within the cold plate 112, and may exit through the outlet 118. In embodiments, the heat sink 110 includes one or more fins 120 positioned at least partially within the one or more fluid passageways 115 extending through the heat sink 110. As the cooling fluid passes through the one or more fluid passageways 115, the cooling fluid may contact the one or more fins 120, dissipating heat from the one or more fins 120, as described in greater detail herein. In embodiments, the one or more fins 120 may include any suitable shape for transferring thermal energy to the cooling fluid, for example and without limitation, plate fins, pin fins, wavy fins, or the like.

Figure 4A:
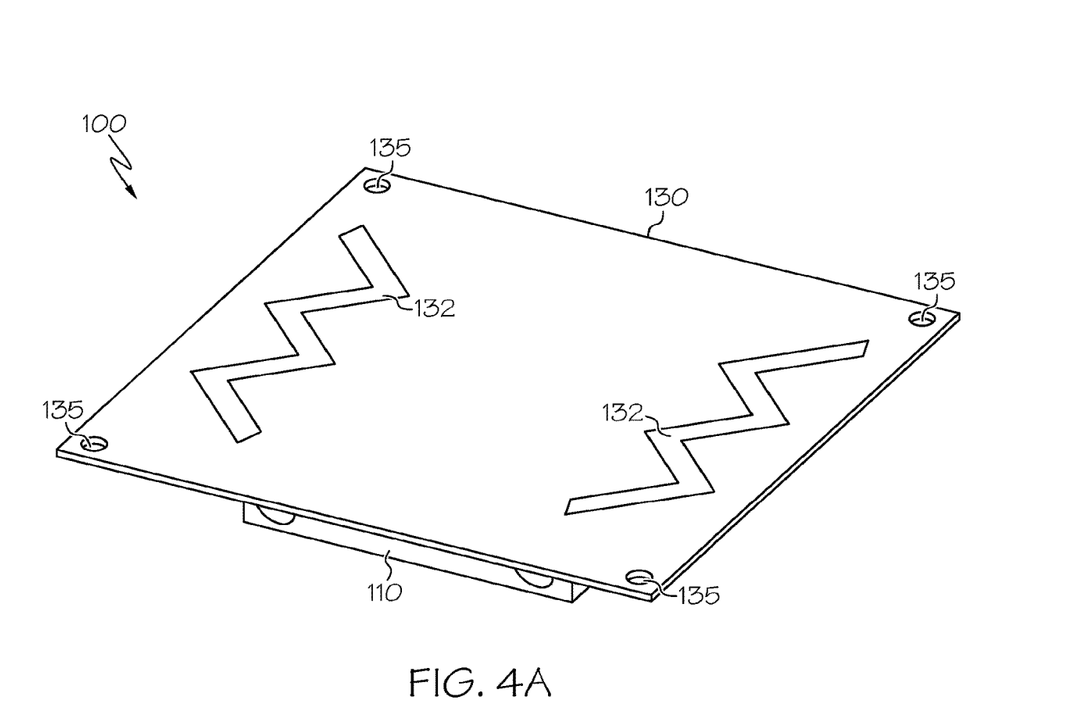
FIG. 4A schematically depicts a perspective view of the heat sink of FIG. 3 and an electrically-insulating layer, according to one or more embodiments shown and described herein.
Figure 4B:
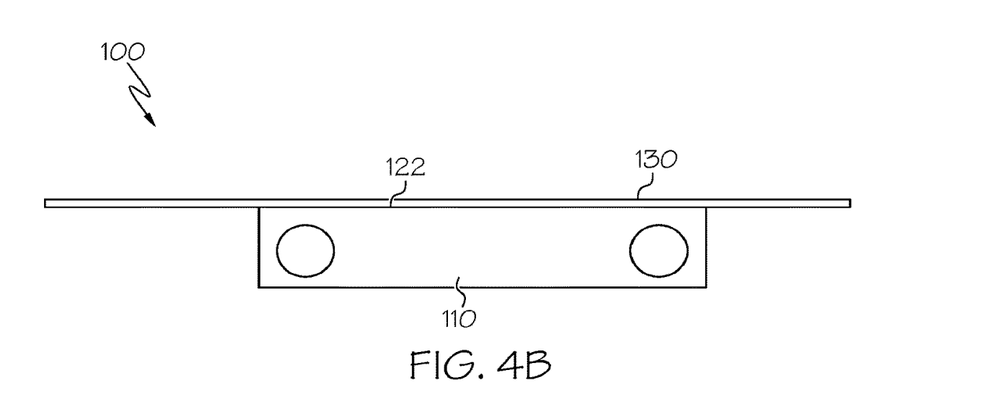
FIG. 4B schematically depicts a front view of the heat sink and the electrically-insulating layer of FIG. 4A, according to one or more embodiments shown and described herein.
Figure 8:
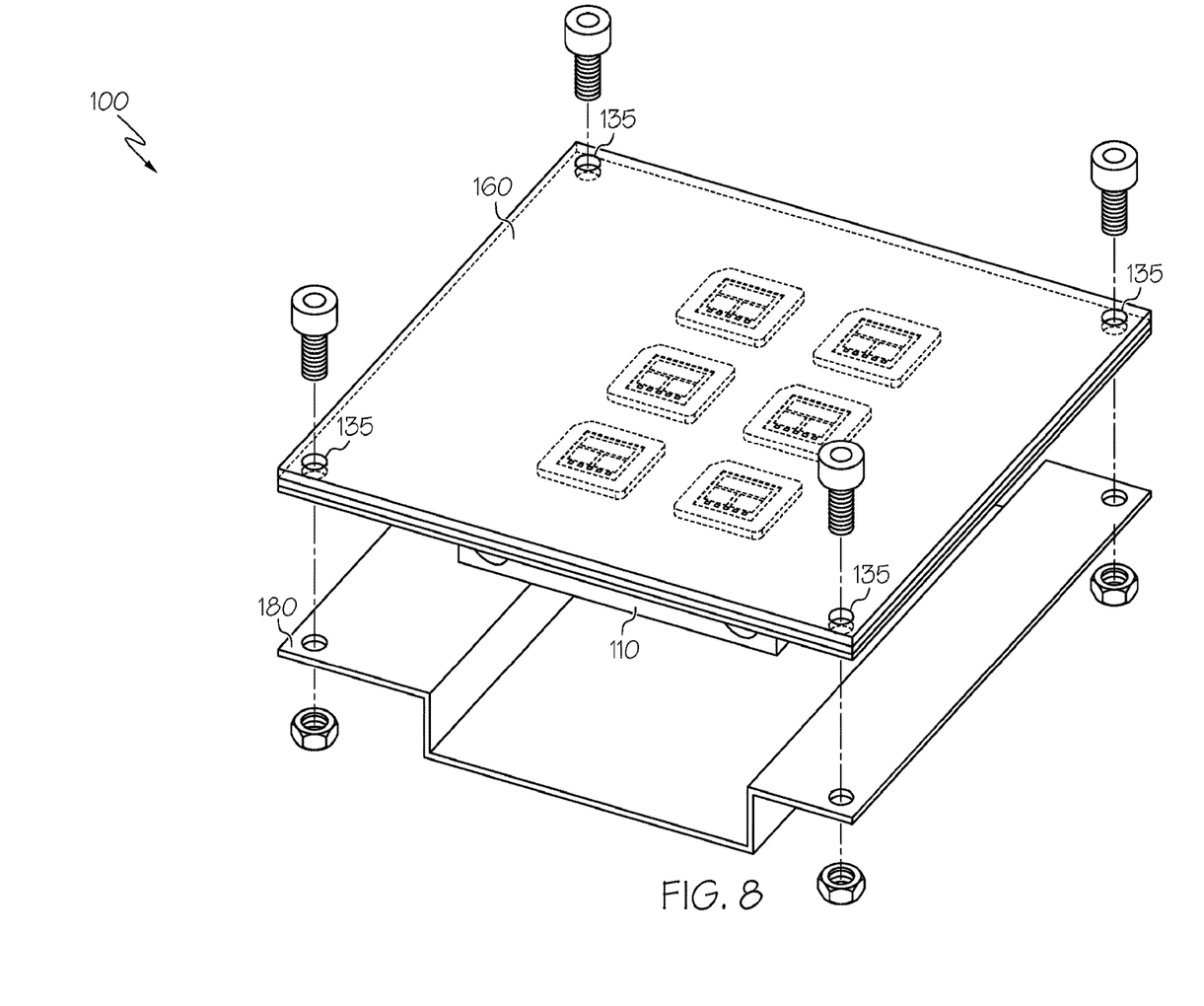
FIG. 8 schematically depicts a perspective view of the power electronics module of FIG. 7B and a clamp, according to one or more embodiments shown and described herein.
Figure 9:
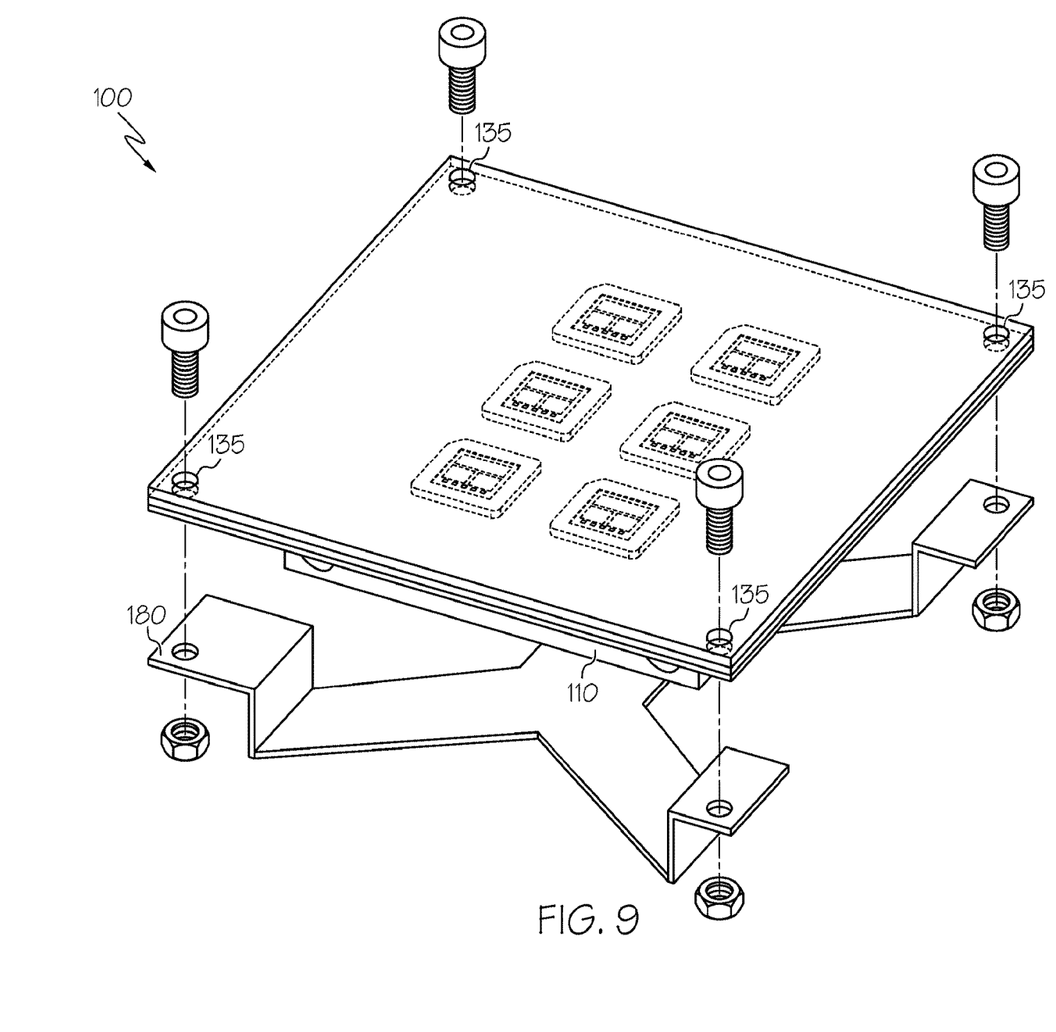
FIG. 9 schematically depicts a perspective view of the power electronics module of FIG. 7B and another clamp, according to one or more embodiments shown and described herein.

Referring to FIGS. 2, 4A, and 4B, a perspective view and a front view of the heat sink 110 is depicted with the electrically-insulating layer 130. In embodiments, the electrically-insulating layer 130 directly contacts the heat sink 110. For example, in the embodiment depicted in FIG. 4B, the electrically-insulating layer 130 directly contacts a surface 122 of the heat sink 110. In some embodiments, the electrically-insulating layer 130 defines one or more through holes 132 that extend through the electrically-insulating layer 130. The one or more through holes 132 assist in retaining the electrically-insulating layer 130 within the printed circuit board layer 160, as described in greater detail herein. In some embodiments, the electrically-insulating layer 130 may define one or more fastener holes 135 that extend through the electrically-insulating layer 130. Mechanical fasteners, such as bolts or the like, can be inserted within the one or more fastener holes 135 to couple components (e.g., a clamp 180 as shown in FIGS. 8 and 9) to the electrically-insulating layer 130 and/or the printed circuit board layer 160. In embodiments, the electrically-insulating layer 130 is formed of a material that restricts the flow of electrical current, for example and without limitation, Alumina ($Al_2O_3$), Aluminum Nitride (AlN), Beryllium Oxide (BeO), or the like.

Figure 5:
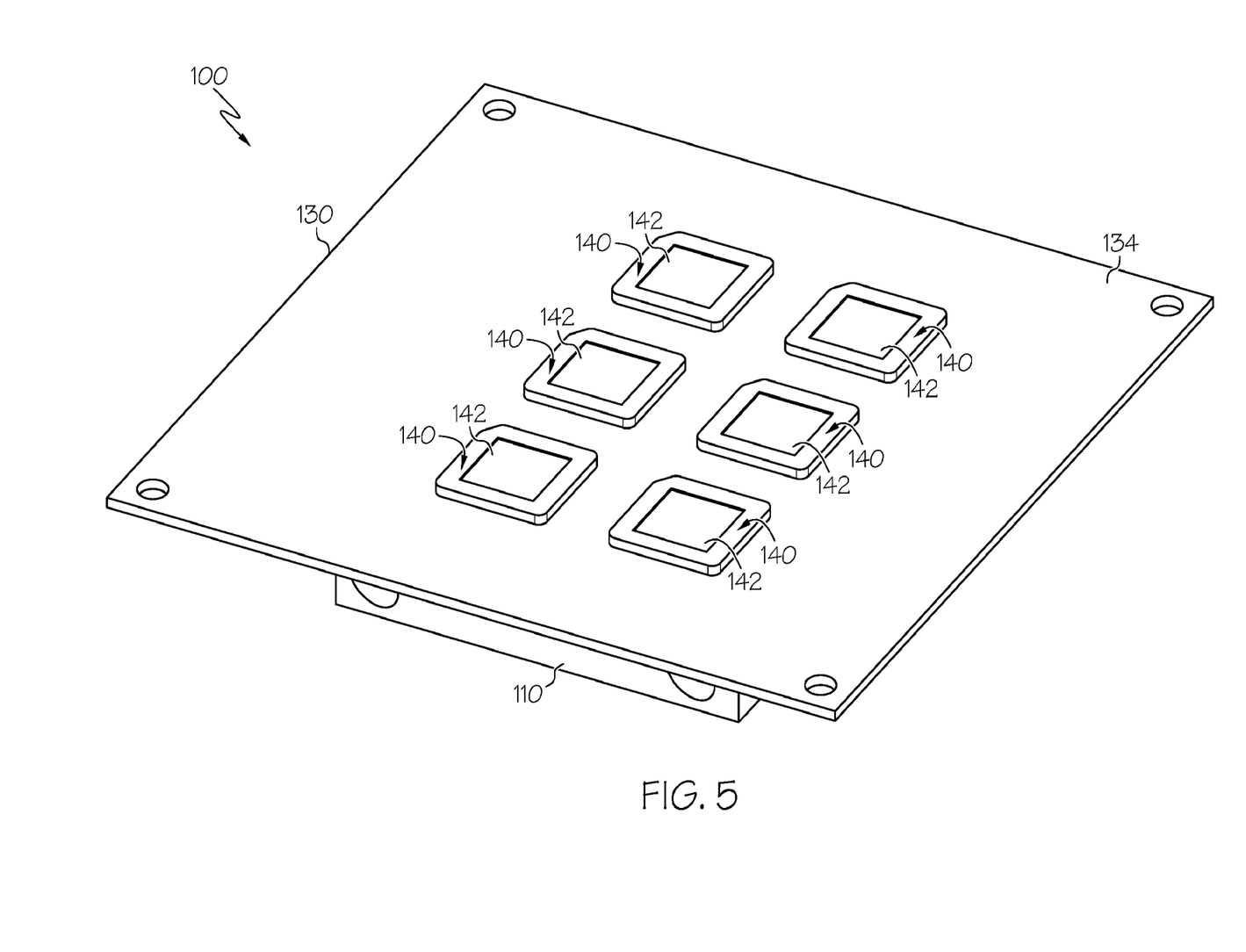
FIG. 5 schematically depicts a perspective view of the heat sink and the electrically-insulating layer of FIG. 4A with one or more conductive substrates positioned on the electrically-insulating layer, according to one or more embodiments shown and described herein.

Referring to FIGS. 2 and 5, a perspective view of the heat sink 110, the electrically-insulating layer 130, and the one or more conductive substrates 140 is schematically depicted. In embodiments, the one or more conductive substrates 140 directly contact the electrically-insulating layer 130. For example, in the embodiment depicted in FIG. 5, the one or more conductive substrates 140 are positioned on a surface 134 of the electrically-insulating layer 130 opposite the heat sink 110. In some embodiments, the one or more conductive substrates 140 are spaced apart from one another on the electrically-insulating layer 130. In this way, in some embodiments, the one or more conductive substrates 140 may be electrically isolated from one another. While in the embodiment depicted in FIG. 5 the power electronics module 100 includes six conductive substrates 140, it should be understood that this is merely an example, and power electronics modules 100 according to the present disclosure may include any suitable number of conductive substrates 140 positioned on the electrically-insulating layer 130. In embodiments, the one or more conductive substrates 140 may be formed of an electrically conductive metal, such as copper or the like.

In some embodiments, the one or more conductive substrates 140 may define cavities 142 extending inwardly into the one or more conductive substrates 140. The one or more power electronics devices 150 (FIG. 1) may be positioned at least partially within the cavities 142, as described in greater detail herein.

Figure 6:
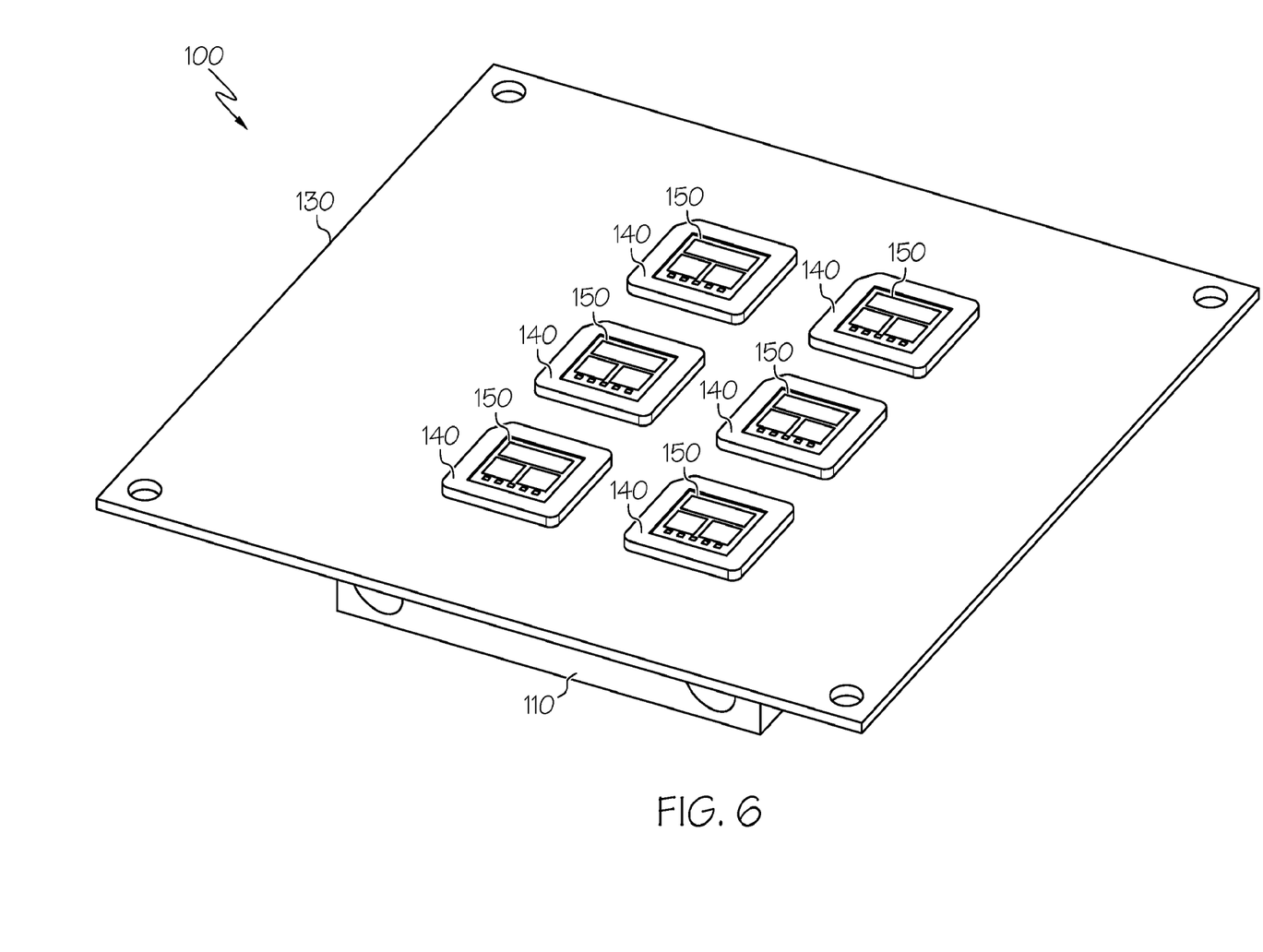
FIG. 6 schematically depicts a perspective view of the heat sink, the electrically-insulating layer, the one or more conductive substrates, and one or more power electronics devices positioned on the one or more conductive substrates, according to one or more embodiments shown and described herein.

For example and referring to FIGS. 2 and 6, a perspective view of the heat sink 110, the electrically-insulating layer 130, the one or more conductive substrates 140, and one or more power electronics devices 150 is schematically depicted. The one or more power electronics devices 150, in embodiments, may directly contact the one or more conductive substrates 140. For example, in some embodiments, the one or more power electronics devices 150 may be positioned within associated cavities 142 of the one or more conductive substrates 140. In some embodiments, the one or more power electronics devices 150 are electrically coupled to the one or more conductive substrates 140.

In some embodiments, the one or more power electronics devices 150 may be coupled to the one or more conductive substrates 140 through any suitable connection, for example and without limitation, a sintered connection, a soldered connection, a welded connection, or the like. In embodiments, the one or more power electronics devices 150 may include any suitable device a semiconductor device such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the power electronics device 150 may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the power electronics device 150 may operate at high current and under high temperatures, for example in excess of 250° C.

Figure 7A:
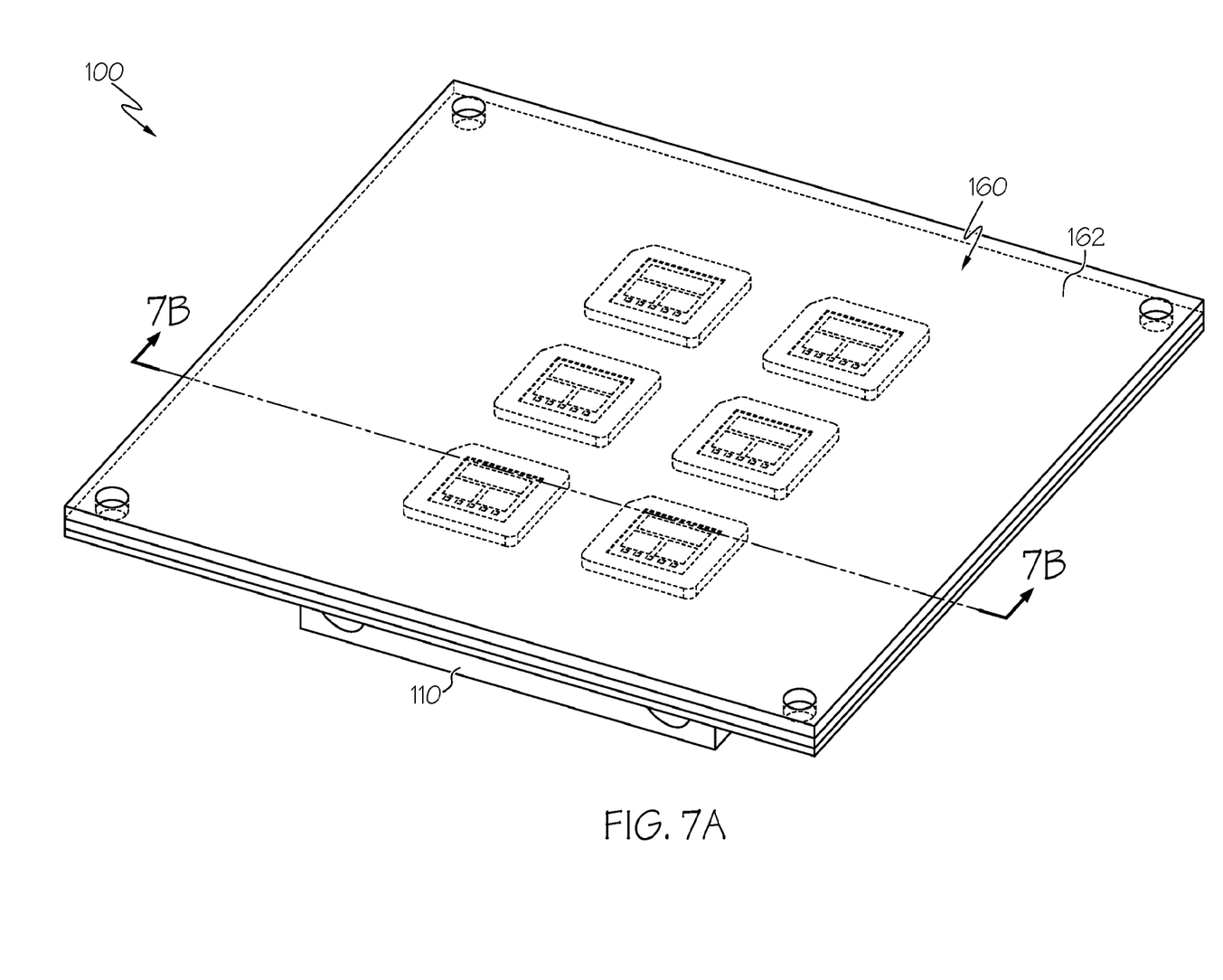
FIG. 7A schematically depicts a perspective view of the heat sink, the electrically-insulating layer, the one or more conductive substrates, and the one or more power electronics devices at least partially embedded by a printed circuit board layer, according to one or more embodiments shown and described herein.
Figure 7B:
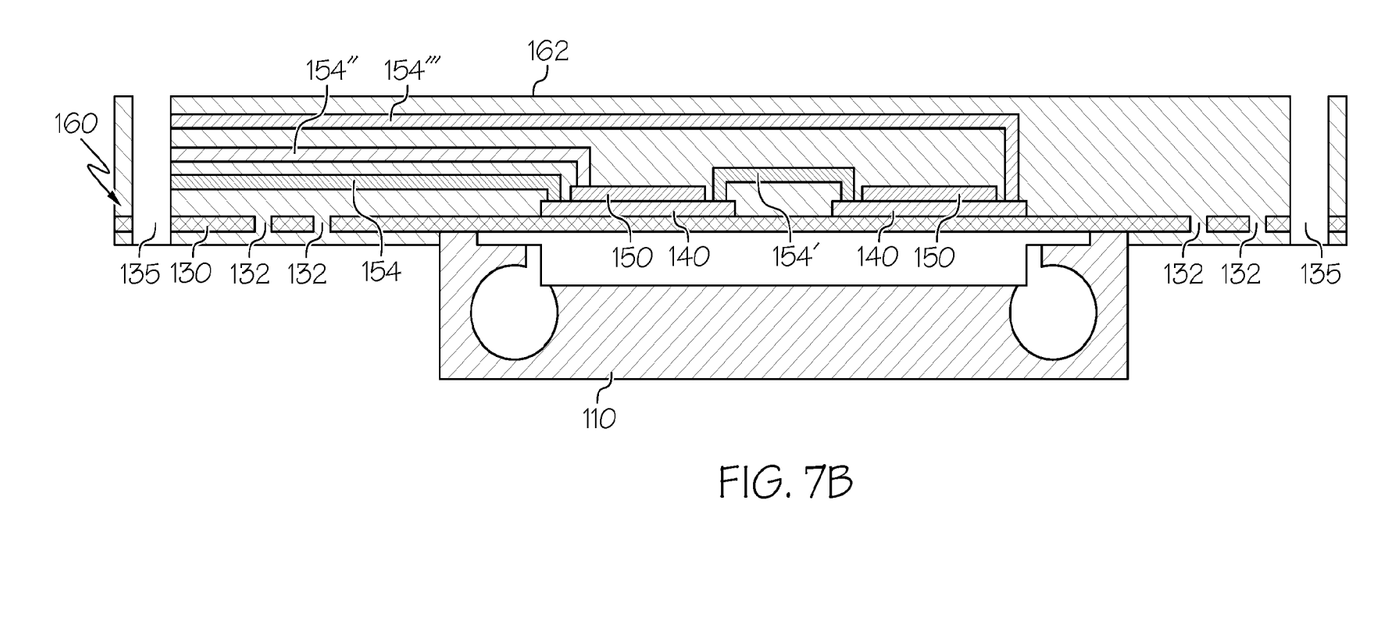
FIG. 7B schematically depicts a section view of the power electronics module of FIG. 7A along section 7B-7B of FIG. 7A, according to one or more embodiments shown and described herein.

Referring to FIGS. 2, 7A, and 7B a perspective view and a section view of the heat sink 110, the electrically-insulating layer 130, the one or more conductive substrates 140, the one or more power electronics devices 150, and the printed circuit board layer 160 is schematically depicted. With the one or more power electronics devices 150 positioned on and coupled to the one or more conductive substrates 140, the printed circuit board layer 160 may be positioned over the electrically-insulating layer 130, at least partially embedding the electrically-insulating layer 130, the one or more conductive substrates 140, and the one or more power electronics devices 150. In some embodiments, the printed circuit board layer 160 may include any suitable material, for example and without limitation, laminates, cotton paper, epoxy, woven glass, matte glass, polyester, or the like and combinations thereof.

In some embodiments and as shown in FIG. 7B, the printed circuit board layer 160 may extend through the through holes 132, which may assist in bonding the printed circuit board layer 160 to the electrically-insulating layer 130.

In some embodiments, the printed circuit board layer 160 may include a conductive surface 162 through which components positioned on the conductive surface 162 can be electrically coupled to one another. For example and referring to FIG. 2, in some embodiments, one or more driver circuit components 170 may be coupled to the conductive surface 162 of the printed circuit board layer 160. In embodiments, the conductive surface 162 of the printed circuit board layer 160 may be formed of any suitable conductor, for example and without limitation, copper or the like. In the embodiment depicted in FIG. 2, the power electronics module 100 comprises six driver circuit components 170, however, it should be understood that power electronics modules 100 according to the present disclosure may include any suitable number of driver circuit components 170. In embodiments, one or more of the driver circuit components 170 may be electrically coupled to one another through the conductive surface 162 of the printed circuit board layer 160. The driver circuit components 170 may include any suitable components or circuitry for controlling operation of the power electronics module 100.

In some embodiments and referring to FIG. 2, the power electronics module 100 includes one or more conduits 154 for electrically coupling the one or more power electronics devices 150. In embodiments, the conduits 154, 154', 154", and 154''' may be utilized to connect positive, negative, and/or ground connections to the one or more power electronics devices 150. In some embodiments, the power electronics module 100 includes a conduit 154' that extends between a first power electronics device 150 and a second power electronics device 150 and electrically couples the first power electronics device 150 to the second power electronics device 150. In some embodiments, the first power electronics device 150 may be electrically coupled to the second power electronics device 150 through the conduit 154' and one or more of the conductive substrates 140. In embodiments, the power electronics devices 150 and the conductive substrates 140 are positioned between one or more of the conduits 154, 154', 154", and 154''' and the electrically-insulating layer 130. For example, in the orientation depicted in FIG. 2, the conduits 154, 154', 154", and 154''' are positioned above the power electronics devices 150. By positioning the power electronics devices 150 between the conduits 154, 154', 154", and 154''' and the electrically-insulating layer 130, the power electronics devices 150 may be positioned in direct contact with the conductive substrates 140, and the conductive substrates 140 may be positioned in direct contact with the electrically-insulating layer 130. Put another way, by positioning the power electronics devices 150 between the conduits 154, 154', 154", and 154''' and the electrically-insulating layer 130, the power electronics devices 150 may be positioned closer to the electrically-insulating layer 130 (and accordingly the heat sink 110) as compared to configurations in which the conduits 154, 154', 154", and 154''' are positioned between the power electronics devices 150 and the electrically-insulating layer 130. While in the section view depicted in FIG. 2 the conduits 154, 154', 154", and 154''' are shown connecting two of the power electronics devices 150, it should be understood that some or all of the power electronics devices 150 of the power electronics module 100 can be coupled to one another by conduits. Further, while in the section view depicted in FIG. 2 the conduits 154, 154', 154", and 154''' are shown at different vertical positions above the power electronics devices 150, it should be understood that the conduits 154, 154', 154", and 154''' may be positioned at the same or at different heights.

In embodiments, by positioning the power electronics devices 150 in direct contact with conductive substrates 140 that are in direct contact with the electrically-insulating layer 130, thermal resistance between the electrically-insulating layer 130 and the power electronics devices 150 can be minimized. Further, by positioning the electrically-insulating layer 130 in direct contact with the heat sink 110, thermal resistance between the electrically-insulating layer 130 and the heat sink 110 can be minimized, thereby minimizing thermal resistance between the power electronics devices 150 and the heat sink 110. In this way, the amount of heat transferred from the power electronics devices 150 to the heat sink 110 can be increased as compared to configurations including intervening layers between the power electronics devices 150 and the conductive substrates 140, between the conductive substrates 140 and the electrically-insulating layer 130, or between the electrically-insulating layer 130 and the heat sink 110. By increasing the amount of heat transferred from the power electronics devices 150, the power electronics devices 150 may be maintained at a lower operating temperature. Alternatively, the power electronics devices 150 may operate at an increased power output as compared to conventional configurations while being maintained at a similar operating temperature.

Referring to FIG. 8 in some embodiments, the power electronics module 100 includes a clamp 180 that can be coupled to the heat sink 110, the electrically-insulating layer 130 (FIG. 7B), and/or the printed circuit board layer 160. The clamp 180, in embodiments, generally extends around the heat sink 110, and may at least partially encapsulate the heat sink 110. The clamp 180 may be coupled to the heat sink 110, the electrically-insulating layer 130 (FIG. 7B), and/or the printed circuit board layer 160 in any suitable manner, for example through mechanical fasteners such as bolts. The clamp 180 may support the heat sink 110, the electrically-insulating layer 130 (FIG. 7B), and/or the printed circuit board layer 160, and may resist torsional forces applied to the heat sink 110, the electrically-insulating layer 130 (FIG. 7B), and/or the printed circuit board layer 160. While in the embodiment depicted in FIG. 8 the clamp 180 is shown as a planar structure, it should be understood that this is merely an example, and the clamp 180 may include any suitable structure to resist torsional forces.

For example and referring to FIG. 9, in some embodiments, the clamp 180 may include a cross or X-shape coupled to opposing corners of the heat sink 110, the electrically-insulating layer 130 (FIG. 7B), and/or the printed circuit board layer 160.

It should now be understood that embodiments described herein are generally directed to power electronics modules including power electronics devices in direct contact with conductive substrates that are in direct contact with an electrically-insulating layer. The electrically-insulating layer is in direct contact with a heat sink. The direct contact between the conductive substrates and the heat sink with the electrically-insulating layer minimizes intermediate components positioned between the power electronics devices and the heat sink, thereby minimizing thermal resistance between the power electronics devices and the heat sink. By minimizing thermal resistance between the power electronics devices and the heat sink, the amount of heat dissipated from the power electronics devices can be increased as compared to configurations including intermediate components positioned between the power electronics devices and the heat sink. By increasing the amount of heat that can be dissipated from the power electronics devices, the power electronics devices can be maintained at lower operating temperatures. Additionally, by increasing the amount of heat that can be dissipated from the power electronics devices, the power electronics devices can be operated at higher power outputs while maintaining a similar operating temperature as compared to conventional configurations. These and other embodiments will now be described with reference to the appended figures.

Having described the subject matter of the present disclosure in detail and by reference to specific embodiments, it is noted that the various details described in this disclosure should not be taken to imply that these details relate to elements that are essential components of the various embodiments described in this disclosure, even in cases where a particular element is illustrated in each of the drawings that accompany the present description. Rather, the appended claims should be taken as the sole representation of the breadth of the present disclosure and the corresponding scope of the various embodiments described in this disclosure. Further, it should be apparent to those skilled in the art that various modifications and variations can be made to the described embodiments without departing from the spirit and scope of the claimed subject matter. Thus it is intended that the specification cover the modifications and variations of the various described embodiments provided such modification and variations come within the scope of the appended claims and their equivalents.

It is noted that recitations herein of a component of the present disclosure being "structurally configured" in a particular way, to embody a particular property, or to function in a particular manner, are structural recitations, as opposed to recitations of intended use. More specifically, the references herein to the manner in which a component is "structurally configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the terms "substantially" and "about" are utilized herein to represent the inherent degree of uncertainty that may be attributed to any quantitative comparison, value, measurement, or other representation. The terms "substantially" and "about" are also utilized herein to represent the degree by which a quantitative representation may vary from a stated reference without resulting in a change in the basic function of the subject matter at issue.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A power electronics module comprising: a heat sink structurally configured to dissipate thermal energy, wherein the heat sink forms a unitary structure; an electrically-insulating layer directly contacting the heat sink; a conductive substrate positioned on and in direct contact with the electrically-insulating layer and a printed circuit board layer; a power electronics device positioned on and in direct contact with the conductive substrate; where the printed circuit board layer at least partially embeds the conductive substrate and the power electronics device; and a driver circuit component positioned on a surface of the printed circuit board layer.

2. The power electronics module of claim 1, wherein the heat sink comprises a cold plate defining a fluid passageway extending through the cold plate.

3. The power electronics module of claim 2, wherein the cold plate comprises one or more fins positioned at least partially within the fluid passageway.

4. The power electronics module of claim 1, wherein the power electronics device is a first power electronics device, and the power electronics module further comprises a second power electronics device at least partially encapsulated by the printed circuit board layer.

5. The power electronics module of claim 4, wherein the first power electronics device is electrically coupled to the second power electronics device.

6. The power electronics module of claim 5, wherein the first power electronics device and the second power electronics device are electrically coupled by a conduit extending between the first power electronics device and the second power electronics device, wherein the first power electronics device and the second power electronics device are positioned between the conduit and the electrically-insulating layer.

7. The power electronics module of claim 1, wherein the driver circuit component is a first driver circuit component, and wherein the power electronics module further comprises a second driver circuit component positioned on the surface of the printed circuit board layer, and wherein the second driver circuit component is electrically coupled to the first driver circuit component.

8. The power electronics module of claim 1, wherein the power electronics device positioned at least partially within a cavity of the conductive substrate.

9. A power electronics module comprising: a heat sink structurally configured to dissipate thermal energy, wherein the heat sink forms a unitary structure; an electrically-insulating layer directly contacting the heat sink; a first conductive substrate in direct contact with the electrically-insulating layer and a printed circuit board layer; a second conductive substrate in direct contact with the electrically-insulating layer and the printed circuit board layer and spaced apart from the first conductive substrate; a first power electronics device positioned on and in direct contact with the first conductive substrate; a second power electronics device positioned on and in direct contact with the second conductive substrate; a conduit extending between and electrically coupling the first power electronics device and the second power electronics device, wherein the first conductive substrate and the second conductive substrate are positioned between the conduit and the electrically-insulating layer; and wherein the printed circuit board layer at least partially embeds the first conductive substrate, the second conductive substrate, the first power electronics device and the second power electronics device.

10. The power electronics module of claim 9, further comprising a driver circuit component positioned on a surface of the printed circuit board layer.

11. The power electronics module of claim 10, wherein the driver circuit component is a first driver circuit component, and wherein the power electronics module further comprises a second driver circuit component positioned on the surface of the printed circuit board layer, and wherein the second driver circuit component is electrically coupled to the first driver circuit component.

12. The power electronics module of claim 9, wherein the heat sink comprises a cold plate defining a fluid passageway extending through the cold plate.

13. The power electronics module of claim 12, wherein the cold plate comprises one or more fins positioned at least partially within the fluid passageway.

14. The power electronics module of claim 9, wherein the first power electronics device is positioned at least partially within a cavity of the first conductive substrate.

* * * * *